(12) United States Patent
Kamble et al.

(10) Patent No.: US 11,438,005 B2
(45) Date of Patent: Sep. 6, 2022

(54) TIMING METHODS FOR SAR ADCS

(71) Applicant: Analog Devices International Unlimited Company, Limerick (IE)

(72) Inventors: Maitrey Kamble, Mumbai (IN); Sandeep Monangi, Srikakulam (IN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/165,428

(22) Filed: Feb. 2, 2021

(65) Prior Publication Data

US 2021/0266007 A1   Aug. 26, 2021

Related U.S. Application Data

(60) Provisional application No. 62/981,883, filed on Feb. 26, 2020.

(51) Int. Cl.
*H03M 1/06* (2006.01)
*H03M 1/46* (2006.01)
*H03M 1/12* (2006.01)

(52) U.S. Cl.
CPC ........... *H03M 1/466* (2013.01); *H03M 1/124* (2013.01)

(58) Field of Classification Search
CPC .......... H03M 1/12; H03M 1/468; H03M 1/38; H03M 7/10; H03M 1/466; H03M 1/1245; H03M 1/46; H03M 1/0863; H03M 1/002; H03M 1/36; H03M 1/66; H03M 1/1023; H03M 1/662; H03M 1/0607; H03M 1/1028; H03M 1/1061; H03M 1/069; H03M 1/123; H03M 1/68; H03M 3/38; H03M 3/37; H03M 3/354; H03M 1/74; H03M 1/44; H03M 1/1225; H03M 1/1205;

(Continued)

(56) References Cited

U.S. PATENT DOCUMENTS 4,940,981 A  * 7/1990 Naylor ................ H03M 1/0607
                                                    341/161
6,359,579 B1 * 3/2002 Chiang ............... H03M 1/0624
                                                    341/161

(Continued)

FOREIGN PATENT DOCUMENTS

CN  113315516 A   8/2021
JP  2012244521 A  12/2012
KR  101686217 B1 12/2016

OTHER PUBLICATIONS

Duan, Yida, et al., "Design Techniques for Ultra-High-Speed Time-Interleaved Analog-to-Digital Converters (ADCs)", PhD Dissertation, UC Berkeley, (2015), 81 pgs.

(Continued)

*Primary Examiner* — Linh V Nguyen
(74) *Attorney, Agent, or Firm* — Schwegman Lundberg & Woessner, P.A.

(57) ABSTRACT

A data converter circuit comprises timing circuitry configured to time stages of a conversion performed by the data converter circuit; a level shifter circuit configured to receive a control signal associated with the conversion and provide a level shifted version of the control signal to one or more switch circuits of the data converter circuit; and a time delay circuit element including a replica circuit of the level shifter circuit that adds a circuit delay to a transition of the control signal at the timing circuitry.

20 Claims, 8 Drawing Sheets

(58) Field of Classification Search
CPC ...... H03M 1/0656; H03M 1/001; H03M 1/34; H03M 1/50; H03M 1/1215; H03M 1/0682; H03M 1/804; H03M 1/462
USPC ........ 341/118, 120, 141, 142, 155, 161, 162
See application file for complete search history.

(56) References Cited

U.S. PATENT DOCUMENTS

| | | | |
|---|---|---|---|
| 6,369,733 B1* | 4/2002 | Tucker | H03M 1/0665 341/143 |
| 6,593,871 B1* | 7/2003 | Miethig | H03M 1/1255 341/157 |
| 7,342,521 B1* | 3/2008 | Liu | H03L 7/07 341/147 |
| 7,982,647 B2* | 7/2011 | Souda | H03M 3/37 341/143 |
| 8,344,925 B1 | 1/2013 | Evans | |
| 8,471,751 B2 | 6/2013 | Wang | |
| 9,035,813 B2* | 5/2015 | Miglani | H03M 3/30 341/143 |
| 9,118,342 B2* | 8/2015 | Singh | H03M 3/37 |
| 9,432,035 B2 | 8/2016 | Vyas et al. | |
| 9,608,652 B2 | 3/2017 | Lee et al. | |
| 9,742,424 B2 | 8/2017 | Sharma et al. | |
| 10,454,489 B2 | 10/2019 | Ryu et al. | |
| 10,659,072 B1 | 5/2020 | Lu | |
| 10,804,919 B1 | 10/2020 | Cranford et al. | |
| 10,826,520 B1 | 11/2020 | Kumar Kundu et al. | |
| 10,886,937 B1* | 1/2021 | Bandyopadhyay | H03M 3/354 |
| 2009/0267817 A1 | 10/2009 | Schatzberger | |
| 2014/0077984 A1* | 3/2014 | Shu | H03M 3/30 341/143 |
| 2016/0065232 A1* | 3/2016 | Dagher | H03M 3/454 341/158 |
| 2021/0021278 A1* | 1/2021 | Belostotski | H03M 1/1245 |

OTHER PUBLICATIONS

Gao, Bo, et al., "Modeling of High-Resolution Data Converter: Two-Step Pipelined-SAR ADC based on ISDM", Electronics, 9(1), (2020), 19 pgs.
Prakash, Neethu, et al., "SAR ADC Using Low Power High Speed Comparator for Precise Applications", Journal of Emerging Technologies and Innovative Research (JETIR), 6(15), (2019), 224-229.
Shi, Yixin, et al., "A Low-Power Area-Efficient SAR-Assisted Hybrid ADC for Ultrasound Imaging", MA Thesis, Delft University of Technology, (Aug. 14, 2017), 76 pgs.
Stepanovic, Dusan Vlastimir, "Calibration Techniques for Time-Interleaved SAR A/D Converters", PhD Dissertation, UC Berkeley, (2012), 114 pgs.
"European Application Serial No. 21158044.4, Extended European Search Report dated Jul. 12, 2021", 13 pgs.
Dashtbayazi, Mohsen, et al., "A 5.3-9.3 fJ/Conversion-Step 4-32 MS/s 10 bit Asynchronous SAR ADC with Optimized DAC Timing Strategy in 0.13 m CMOS", Journal of Electrical Systems and Signals, vol. 2, No. 2, (Dec. 1, 2014), 1-10.
Hwang, Young-Ha, et al., "A 20 k-to-I00kS/s Sub- $\mu$ W 9.5b-ENOB Asynchronous SAR ADC for Energy-Harvesting Body Sensor Node SoCs in 0.18- $\mu$ m CMOS", IEEE Transactions on Circuits and Systems II: Express Briefs, IEEE, US, vol. 65, No. 12, (Dec. 1, 2018), 1814-1818.
Park, Hyung-Gu, et al., "A Design of a Wireless Power Receiving Unit With a High-Efficiency 6.78-MHz Active Rectifier Using Shared DLLs for Magnetic-Resonant A4 WP Applications", IEEE Transactions on Power Electronics, Institute of Electrical and Electronics Engineers, USA, vol. 31, No. 6, (Jun. 1, 2016), 4484-4498.
Park, Young-Jun, et al., "A Triple-Mode Wireless Power-Receiving Unit With 85.5% System Efficiency for A4WP, WPC, and PMA Applications", IEEE Transactions on Power Electronics, vol. 33, No. 4, (Apr. 1, 2018), 3141-3156.
Wang, Aili, et al., "A 10-bit 50-MS/s SAR ADC with 1 fJ/Conversion in 14?nm SOI FinFET CMOS", Integration, The VLSI Journal, North-Holland Publishing Company. Amsterdam, NL, vol. 62, (Mar. 28, 2018), 246-257.

* cited by examiner

TIMING METHODS FOR SAR ADCS

FIELD OF THE DISCLOSURE

This document relates to integrated circuits and in particular to analog-to-digital converter (ADC) circuits.

BACKGROUND

ADC circuits are used to quantify an analog signal as a digital quantity that can be used in signal processing. There is demand for improvement in the speed of ADC circuit and improvement in the circuit area needed for ADC circuits. However, design challenges can arise as speeds demanded for SAR ADCs becomes higher and lower geometry processes are chosen for SAR ADCs.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
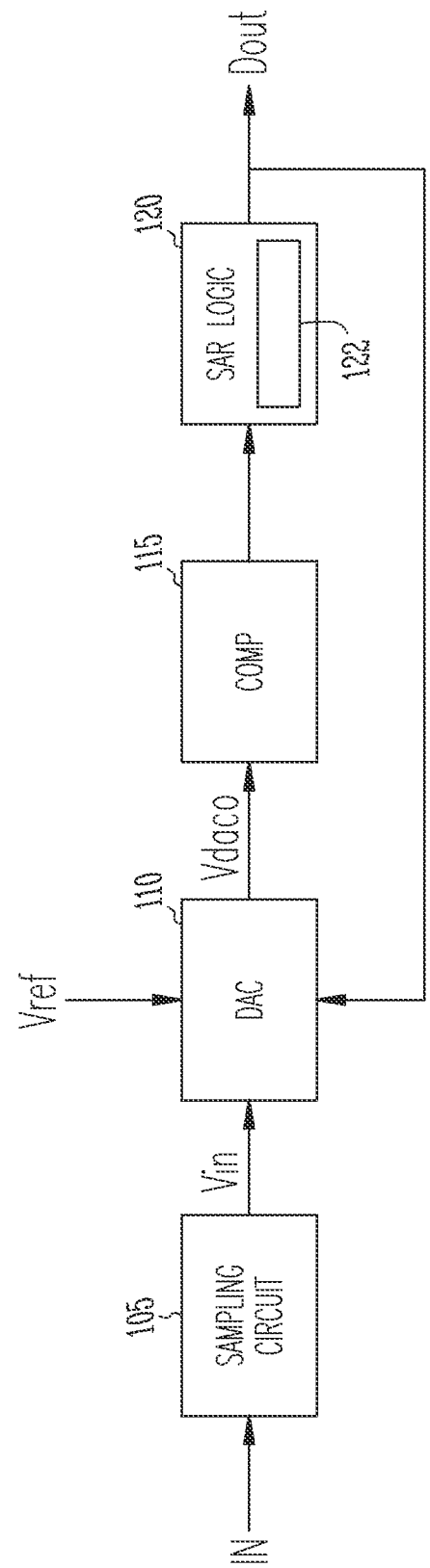
FIG. 1 is a functional block diagram of an example of a successive approximation register analog-to-digital converter (SAR ADC) circuit.

FIG. 1 is a functional block diagram of an example of a successive approximation register analog-to-digital converter (SAR ADC) circuit. The SAR ADC circuit 100 includes a capacitive digital-to-analog converter (cap-DAC) circuit 110, a sampling circuit 105 that may be included in the cap-DAC circuit 110, a comparator circuit 115, logic circuitry 120, and timing circuitry 122 or a timer. The SAR ADC circuit 100 converts a sampled input voltage into a digital code by successively comparing the sampled input charge with different amounts of reference charge. The time-period over which this activity occurs is known as 'Conversion Time' ($T_{CONV}$).

Figure 2:
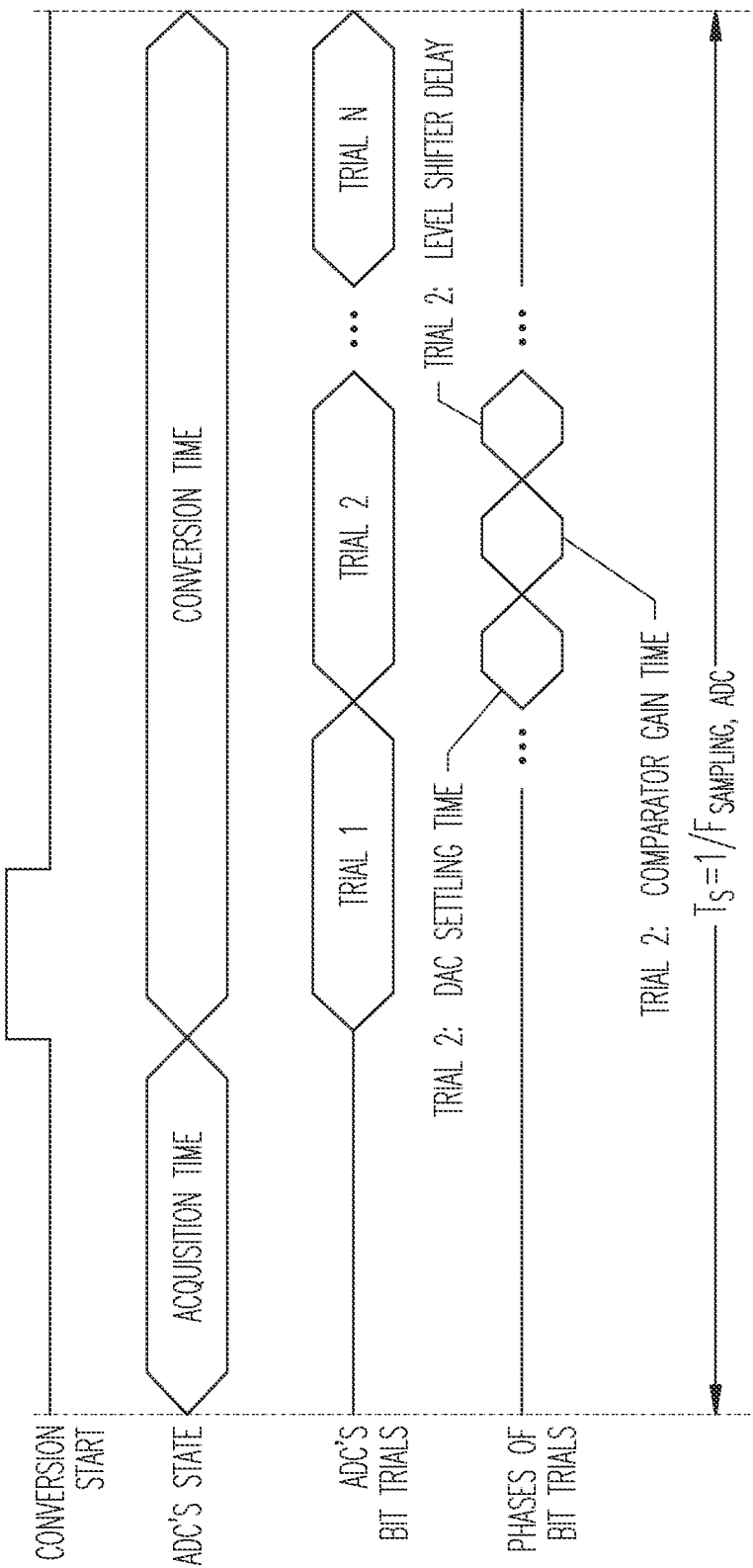
FIG. 2 is an example of a timing diagram of a conversion by an SAR ADC.

FIG. 2 is a timing diagram of a conversion by an SAR ADC. As shown in FIG. 2, the overall conversion time ($T_{CONV}$) is comprised of several sections, referred to as bit-trials. In each bit-trial, the sampled input charge is compared with an amount of reference charge chosen by the SAR logic circuitry. The SAR logic circuitry changes the value of reference charge from one bit-trial to another bit trial such that, at the end of N bit trials, the sampled input voltage may be represented by a N-bit digital word, where N is a positive integer. In an example intended to be non-limiting, a precision ADC may include 16 bits, or N=16. The timing circuitry or 'Timer' controls the timing of various bit-trials and other events (e.g., power-up of comparators, auto-zeroing etc.) during the conversion by the SAR ADC.

FIG. 2 also shows that a single bit-trial can be further divided into phases. In FIG. 2, bit-trial 'Trial 2' is shown divided into a DAC settling time, a comparator gain time, and a level shifter delay.

The cap-DAC circuit of an SAR ADC contains bottom-plate (BP) switches that connect its capacitive circuit elements to reference voltages. The SAR logic circuitry manipulates the states of the BP switches at the beginning of the bit-trial, such that the cap-DAC circuit produces an output voltage that corresponds to the difference between the sampled input charge and a chosen amount of reference charge. The DAC settling time ($T_{ST}$) is the time duration from the moment of alteration of state of the BP switches to the moment when the output voltage of the cap-DAC circuit settles sufficiently with respect to time.

The output voltage of the cap-DAC circuit is then fed to the comparator circuit which compares it with a reference voltage ($V_{REF}$). This comparison determines whether the sampled input charge is greater than or less than the chosen amount of the reference charge. The comparator circuit may consist of a pre-amplifier stage followed by a regeneration-latch. The pre-amplifier generates an output voltage that is an amplified version of its input voltage. The regeneration latch samples the output of the pre-amplifier and gives a digital output result of a 1 or 0, signifying whether the sampled input charge was greater than or less than the chosen reference charge for the bit-trial. The comparator gain time ($T_{GT}$) is the time duration from the moment of end of $T_{ST}$ phase of a bit-trial to the moment when regeneration latch samples the pre-amplifier's output.

The time duration from the moment of availability of regeneration-latch's output of a particular trial to the moment of alteration of states of the cap-DAC's reference switches for the next trial is known as bottom-plate level shifters' delay ($T_{BP,LVL}$). This time duration may be dependent on the type of devices in the SAR ADC.

In a given complementary metal oxide semiconductor (CMOS) fabrication process, at least two types of CMOS devices are available: core CMOS domain devices and input-output (I/O) CMOS domain devices. The core domain devices and I/O domain devices can differ in size, oxide thickness, carrier mobility, noise characteristics, etc. For example, the core domain devices offer a device length that can be the minimum permitted by the fabrication process node ($L_{MIN}$) and the core devices operate on a lower 'core domain supply voltage'. The I/O domain devices offer device lengths much greater than $L_{MIN}$, and they operate on a higher 'I/O domain supply voltage'. Due to the difference in size of the devices, the core domain devices can operate at much faster speed than their counterpart I/O domain devices.

It is preferred that SAR ADCs that need to obtain high dynamic range (DR) handle input voltages that can be as high as the I/O supply voltage. However, to get the best speed out of the SAR ADC, as many of the SAR ADC sub-blocks as possible are designed using core domain devices.

For example, in a 0.18 micrometer (0.18 um) process, the core domain transistors (with length of 0.18 um) operate using a 1.8V core domain supply voltage, but the SAR ADC needs to convert a voltage up to 3V, which is greater than the core domain supply voltage. In this case, the input sampling switches as well as reference switches of the cap-DAC circuit need to be implemented with I/O domain devices operating on a 3V I/O domain supply voltage, with length much higher than 0.18 um. For harnessing the maximum speed permitted by the process, all the circuitry of the timer, the comparator, and a section of SAR logic circuitry should be implemented with core domain devices. However, to maximize the Dynamic Range (DR) permitted by the fabrication process, the SAR logic circuitry needs to employ level shifters to take the output signal of the comparator from the 1.8V core domain and level shift the output signal to the 3V I/O domain to manipulate the reference charge required for comparison in the next bit-trial.

As the speed demanded by SAR ADCs becomes higher and lower geometry process nodes are chosen for SAR ADCs, the numerical values of $T_{ST}$ and $T_{GT}$ may become comparable to $T_{BP,LVL}$ and improvement in speed of SAR ADCs may be realized by improvement in $T_{BP,LVL}$. To maximize speed and dynamic range of an SAR ADC, most of the circuit blocks of the SAR ADC are designed with core domain devices while the input to the SAR ADC is designed with I/O domain devices.

Figure 3:
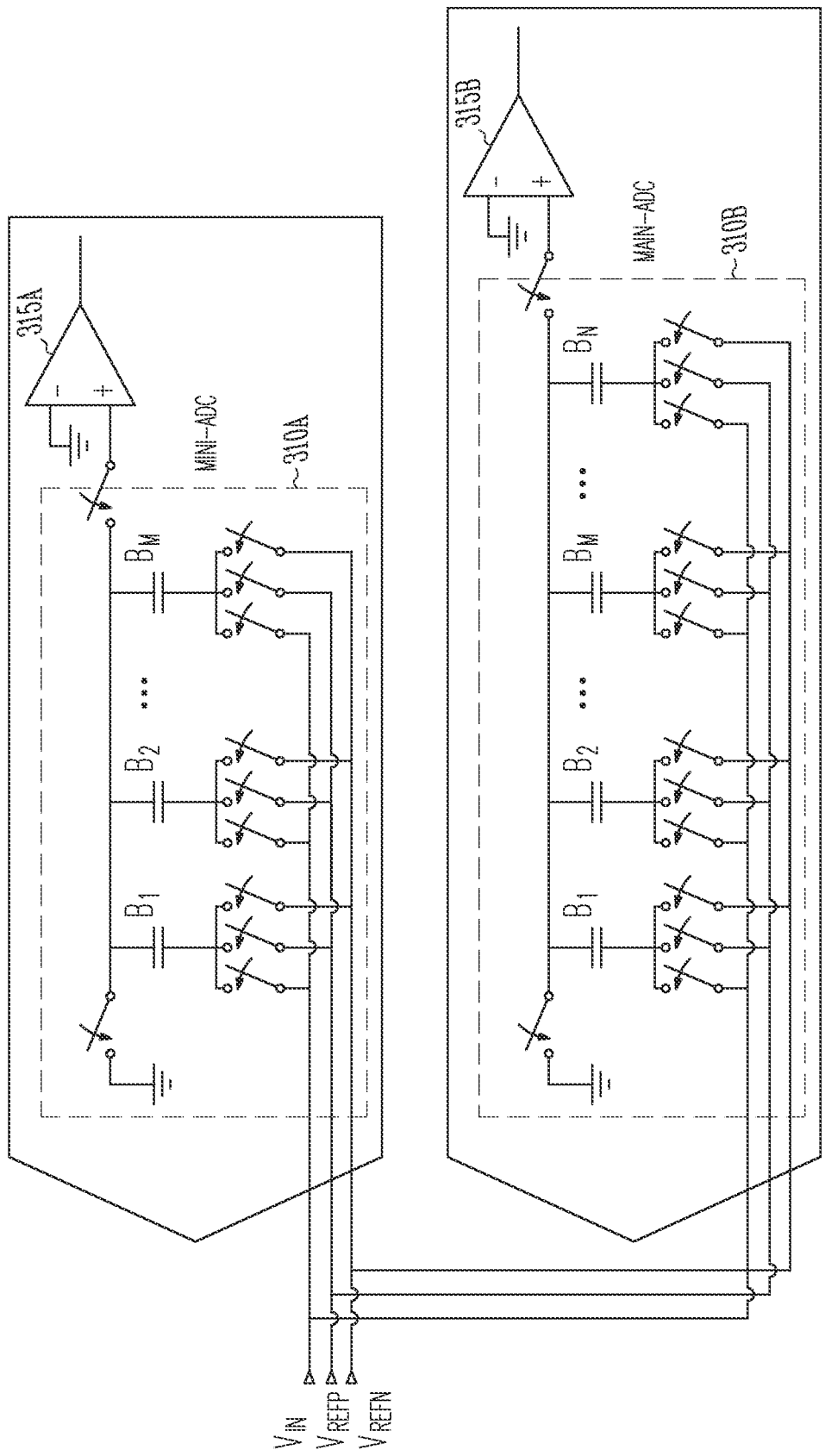
FIG. 3 is circuit diagram of an example of a two-stage SAR ADC circuit.

FIG. 3 is circuit diagram of a two-stage or pipeline SAR ADC. Two SAR ADCs are employed to process the same input ($V_{IN}$) and reference voltages ($V_{REFP}$, $V_{REFN}$). The first converter, called a mini-ADC, has a cap-DAC 310A that contains bottom-plate switches and top-plate switches as well as a comparator 315A that are designed using I/O domain devices only. Therefore, the mini-ADC can directly obtain M most-significant-bits (MSBs) of the conversion result. The results of these M bits are loaded onto the second converter, known as the main-ADC, which contains only bottom-plate switches which operate in the I/O domain supply. The rest of main-ADC (including the top switches and comparator 315B) is designed using only core domain devices that operate in the core domain supply. The main-ADC is designed to have a N-bit cap-DAC 310B, where N and M are both positive integers and N>M. It loads results of the M MSBs determined by the mini-ADC and then proceeds to perform N-M bit-trials, resulting in overall N-bit conversion.

If M is reasonably high (e.g., M>3), then none of the core domain devices of the main-ADC will experience voltages greater than the core-supply voltage, and therefore, the overall SAR ADC converts an input voltage as high as the I/O domain supply voltage, while mostly operating in core domain supply voltage.

However, there are certain design pitfalls involved with the multi-stage analog-to-digital (A/D) conversion approach. One pitfall is that the input bandwidths of mini-ADC and main-ADC need to match very well. Otherwise, different input voltages will be sampled by them, resulting in errors in overall conversion. Another pitfall is that the instance of input voltage sampling by the mini-ADC and main-ADC needs to coincide very well. This is especially true for sampling high frequency inputs. The higher the mismatch of sampling instances, the more error will result in the overall conversion.

As a general trend, the push for higher ADC speed and lower geometry ADC designs have reduced the time durations of $T_{ST}$, $T_{GT}$, and $T_{BP,LVL}$. However, techniques to improve $T_{BP,LVL}$ typically result in increased current consumption during the acquisition phase of the SAR ADC. Consequently, the techniques result in an increase in throughput of SAR ADCs that does not scale with the increase in power consumption.

To optimize the speed of the converter by improving $T_{BP,LVL}$, the Timer of an ADC should allocate just enough time for the $T_{BP,LVL}$ phase for a given Silicon Fabrication Process, Supply Voltage, or Temperature (PVT) corner. However, developing timing circuitry that optimizes $T_{BP,LVL}$ across all possible variations in the PVT corners (also known as 'skew lots') involves significant process characterization efforts.

The Timer of an ADC may include time delay circuit elements. If the delay element that generates $T_{BP,LVL}$ has different PVT variation trends as compared to the delay of the actual bottom-plate level shifters, the delay provided by the delay element needs to be trimmed either on die-die basis or in a 'blind-trim' manner. The part-by-part trimming procedure may be a complicated procedure as an insufficient $T_{BP,LVL}$ time can result in loading an incorrect result onto the cap-DAC, which can lead to gross degradation in SNR and eventually can lead to functional failure. Developing trim settings that work across all potential PVT corners (or all potential skew lots) can be a cumbersome exercise.

Additionally, aligning the sampling of a multi-stage SAR ADC can be challenging. As described previously herein, the sampling instances of by the mini-ADC and the main-ADC need to be aligned and synchronized. Failure to do so results in loss of redundancy between the two stages and eventually SNR degradation for high frequency inputs. Typically, the I/O domain devices are much slower than core domain devices for a given CMOS fabrication process. Because the controlling circuitry for sampling events of mini-ADC and main-ADC are included in the I/O domain and the core domain respectively, achieving synchronization between the stages can be difficult for a high-frequency input application.

Figure 4:
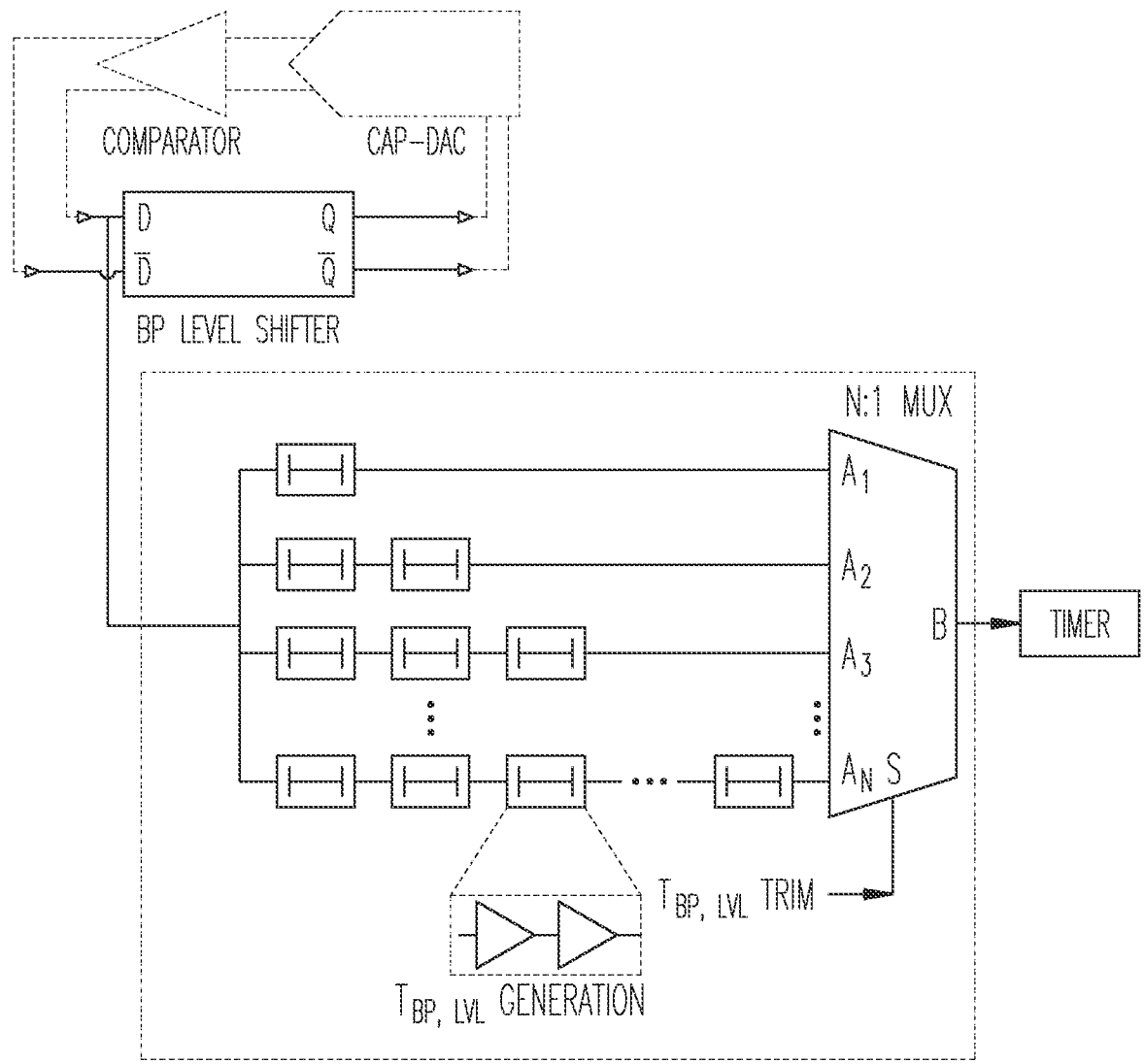
FIG. 4 is a block diagram of an example of an approach to implement a trim-able level shifter delay for timing circuitry of an SAR ADC.

FIG. 4 is a block diagram of an example of an approach to implement a trimmable $T_{BP,LVL}$ for a Timer of an SAR ADC. A different amount of delay for the $T_{BP,LVL}$ phase is selected or programmed by setting the $T_{BP,LVL}$ Trim bits of the multiplexer. However, there are limitations associated with this approach. The realized $T_{BP,LVL}$ in the approach of FIG. 4 is essentially a propagation delay provided by inverters or buffers that are comprised of core domain devices. Therefore, the realized $T_{BP,LVL}$ is dependent on the PVT process corners of core domain devices as well as on the domain core supply voltage. However, the required $T_{BP,LVL}$ should accommodate process PVT corners of both core domain devices and I/O domain devices, as well as both the core domain supply voltage and the I/O domain supply voltage.

Consequently, if the required $T_{BP,LVL}$ has the maximum value of time 'T' across the PVT variation, then the realized $T_{BP,LVL}$ will need to have time 'T' as the minimum value across its PVT variation. The overall PVT variation of the realized 'T' may be a maximum value as great as 2T. This can lead to needless wasting of conversion time of 'N(T)', where N is the number of bit-trials in the conversion. Because $T_{ST}$ and $T_{GT}$ have become comparable to $T_{BP,LVL}$, the needless extra conversion time to accommodate PVT variation can significantly increase the overall conversion time.

Figure 5:
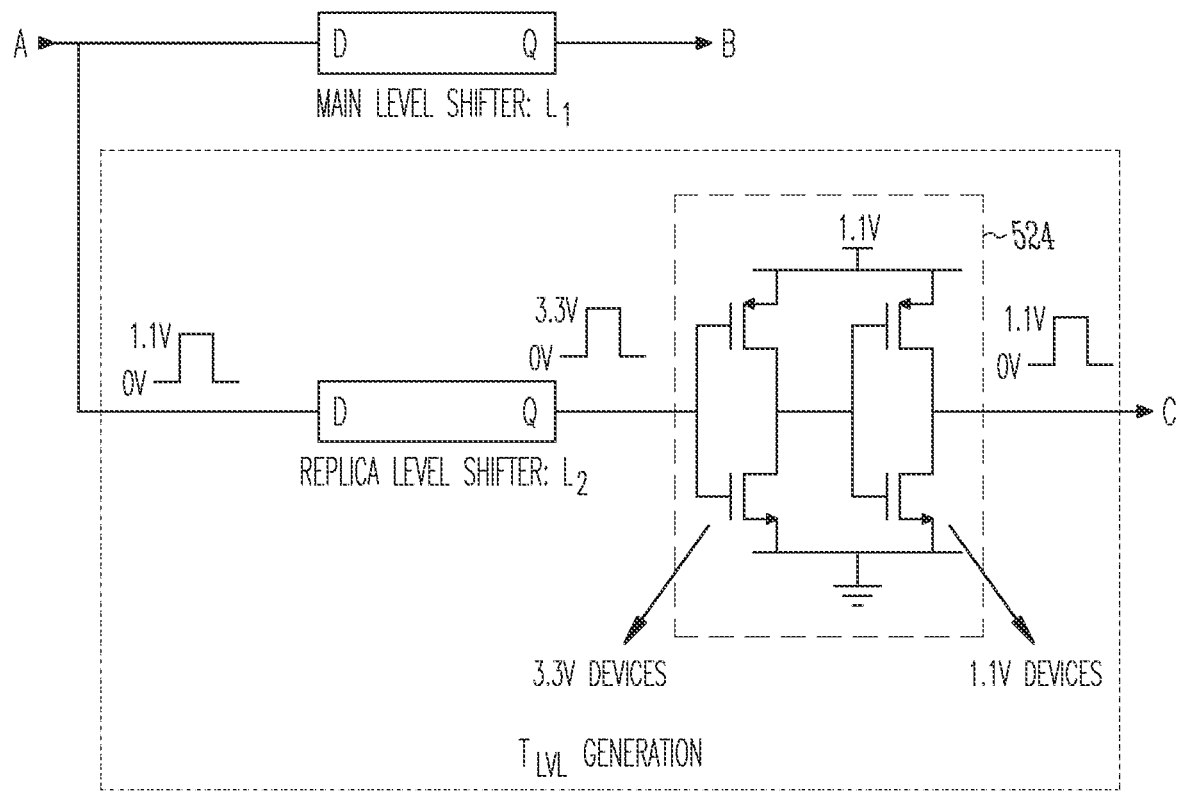
FIG. 5 is a block diagram of an example of another approach to implement a level shifter delay.
Figure 5:
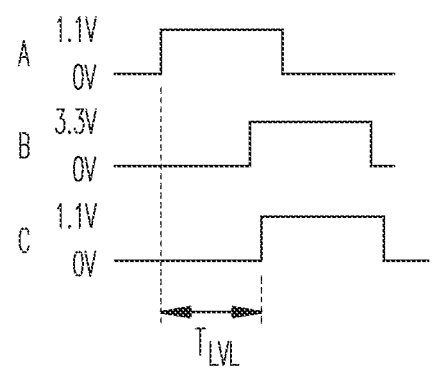

FIG. 5 is a block diagram of an example of an approach to implement a level shifter delay. The circuit includes a main voltage level shifter ($L_1$) that can provide a control signal for the switches connected to the BP connection of a cap-DAC. The approach adds a replica circuit path that provides the level shifter delay. The replica circuit path generates a delay that tracks the propagation delay of the actual BP level shifter instance ($L_1$) across variations in PVT. The replica path includes a replica level shifter instance ($L_2$) of instance $L_1$ and a buffer 524. The input to $L_2$ is the core supply voltage (e.g., 1.1V) and the output of $L_2$ is the I/O supply voltage (e.g., 3.3V). The output of $L_2$ is applied to a first inverter that operates in the core supply domain but has I/O domain devices. The output of the first inverter is applied to a second inverter that operates in the core supply domain and has core domain devices. The result is that the total delay from the input to the output of the replica path is slightly greater than the propagation time required by the actual level shifter instance $L_1$ for any given PVT corner, including for both I/O domain devices and core domain devices.

Figure 6:
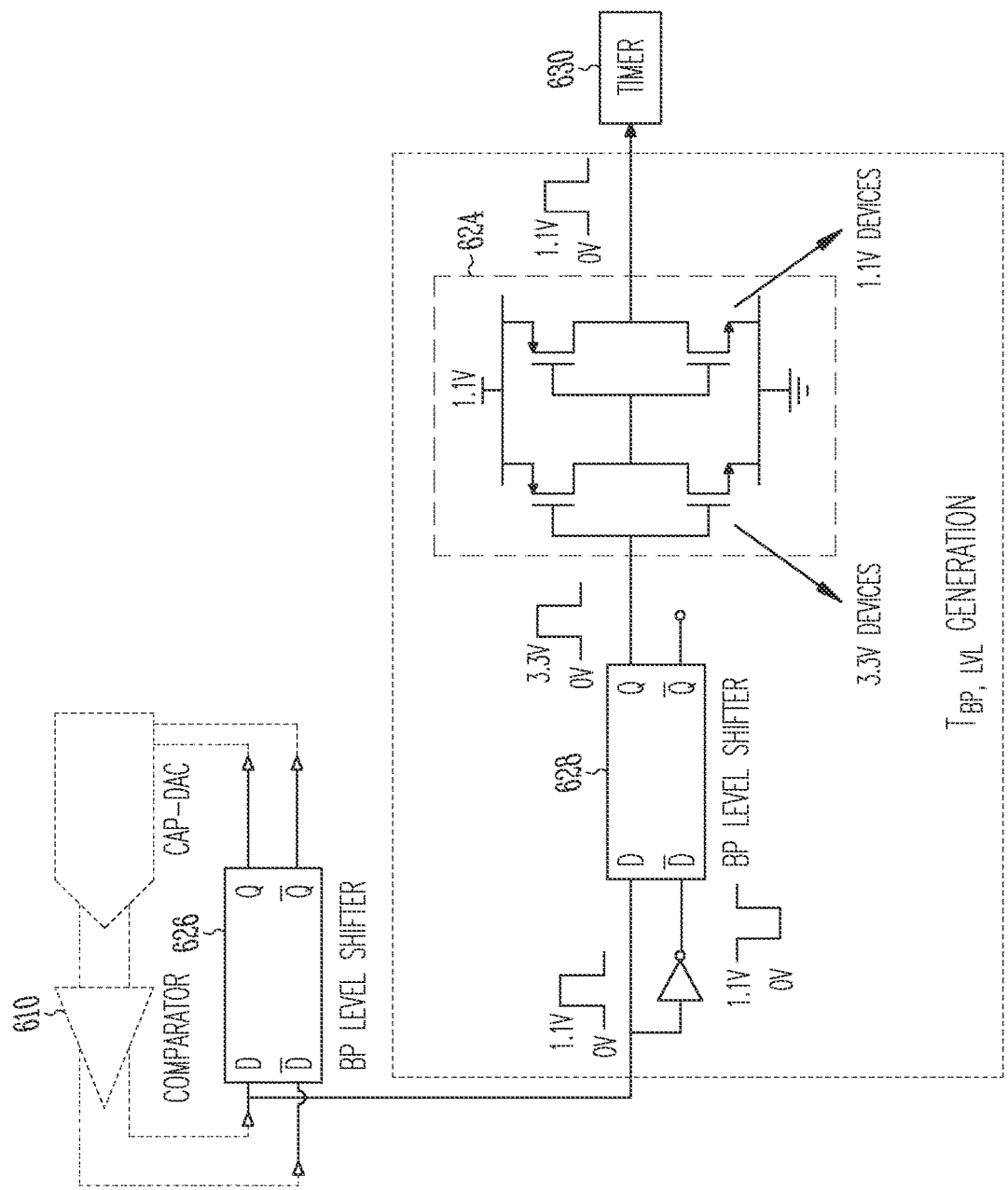
FIG. 6 is a block diagram of an example using a level shifter delay with timing circuitry of an SAR ADC.

FIG. 6 is a block diagram of an example of using a replica circuit path to generate $T_{BP,LVL}$ for an SAR ADC. The input to the replica circuit path is the output of the comparator 610 of the SAR ADC which is also fed to the actual BP level shifter 626. As in the example of FIG. 5, the replica path includes a replica level shifter 628 and a buffer 624. The replica level shifter 628 is a replica of the actual BP level shifter 626 coupled to the output of the comparator 610. The buffer 624 includes an inverter comprised of I/O domain devices and an inverter comprised of core domain devices. Both inverters operate using the core supply. The output of the replica path is provided to the Timer 630 of the SAR ADC. The delay created by the replica circuit path ensures that the inputs from the comparator 610 are propagated through the BP level shifters and are available for the BP switches of cap-DAC. After this delay, the DAC settling time $T_{ST}$ for next bit trial can be timed by the Timer 630. With the replica circuit path, the SAR ADC is timed at optimal speed and the wasted time for a conversion due to allowing for PVT variation is minimized.

Figure 7:
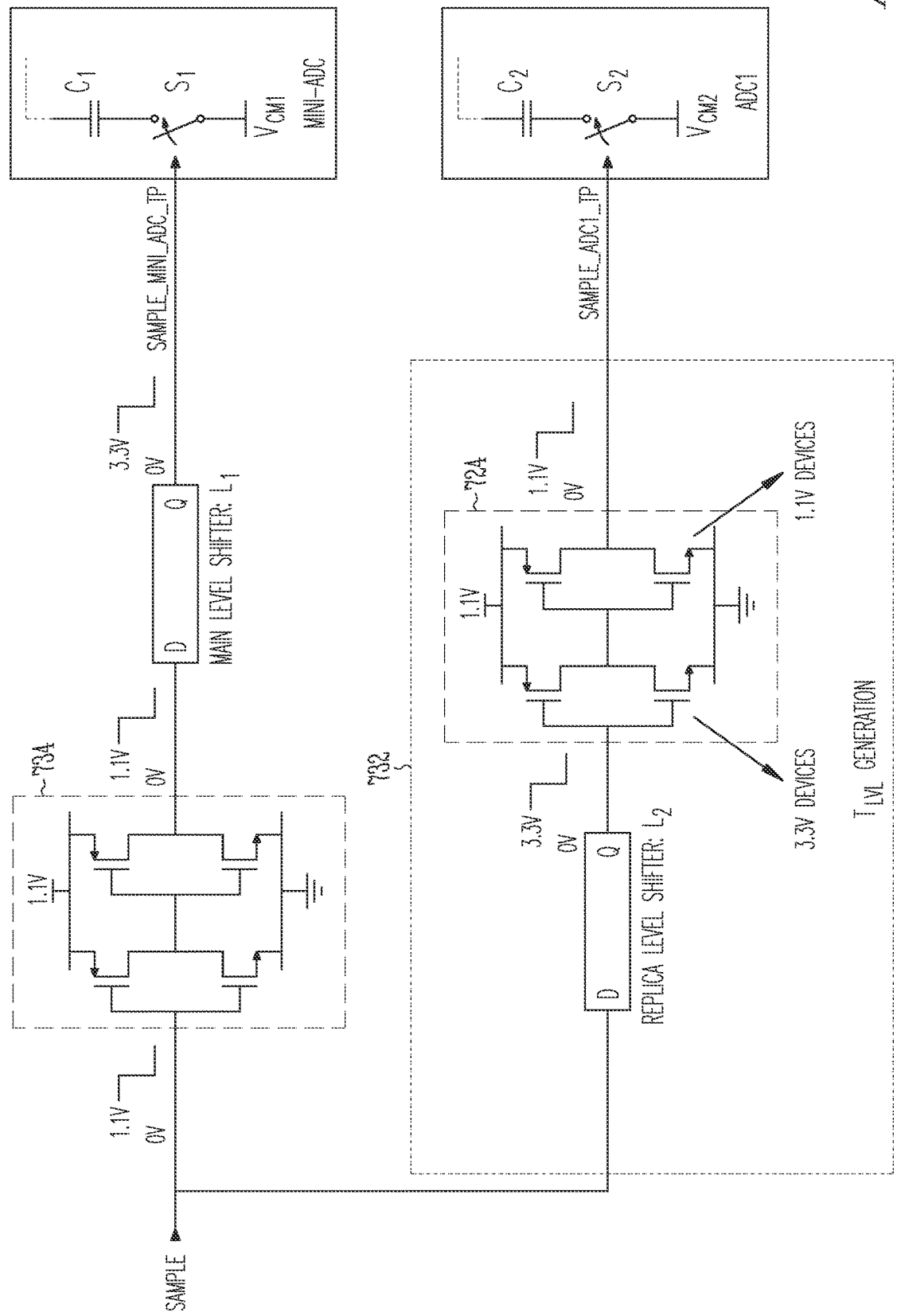
FIG. 7 is a block diagram of an example of using a level shifter delay in sampling control paths of a multi-stage SAR ADC circuit.

FIG. 7 is a block diagram of an example of using replica circuit paths in sampling control paths of a multi-stage SAR ADC. The example shows the top plate (TP) sampling network of the mini-ADC circuit and the main ADC circuit represented by switch $S_1$ for the mini-ADC and switch $S_2$ for the main ADC. Both switches sample with respect to a common mode voltage in response to a negative edge of the "Sample" signal from the Timer. Because the mini-ADC stage handles inputs from the I/O domain supply, switch $S_1$ is an I/O domain device and the common mode voltage $V_{CM1}$ of the top plate is the common mode corresponding to the I/O domain supply. The top plate sampling network of the mini-ADC stage is controlled by a signal 'sample_mini_adc_tp' level shifted to the I/O domain supply.

The main ADC stage handles inputs from the core domain supply, and switch $S_2$ is a core domain device and the common mode voltage $V_{CM2}$ of the top plate corresponds to the common mode of the core domain supply. The top plate sampling network of the main-ADC stage is controlled by a signal 'sample_adc1_tp' of the core domain supply. As explained previously herein, the sampling instances of the mini-ADC stage and the main-ADC stage need to be aligned and synchronized. This can be done by inserting a replica level-shifting circuit path 732 between the 'sample' signal and the 'sample_adc1_tp' signal as shown in FIG. 7. The replica circuit path includes a replica $L_2$ of the instance of the main level shifter $L_1$ used for the mini-ADC and a buffer 724 that includes two inverters. Another buffer 734 is added prior to the main level shifter $L_1$ for better alignment of the two sampling instances. The approach of FIG. 7 reduces the need for redundant circuitry used in other approaches to address the alignment issue.

Figure 8:
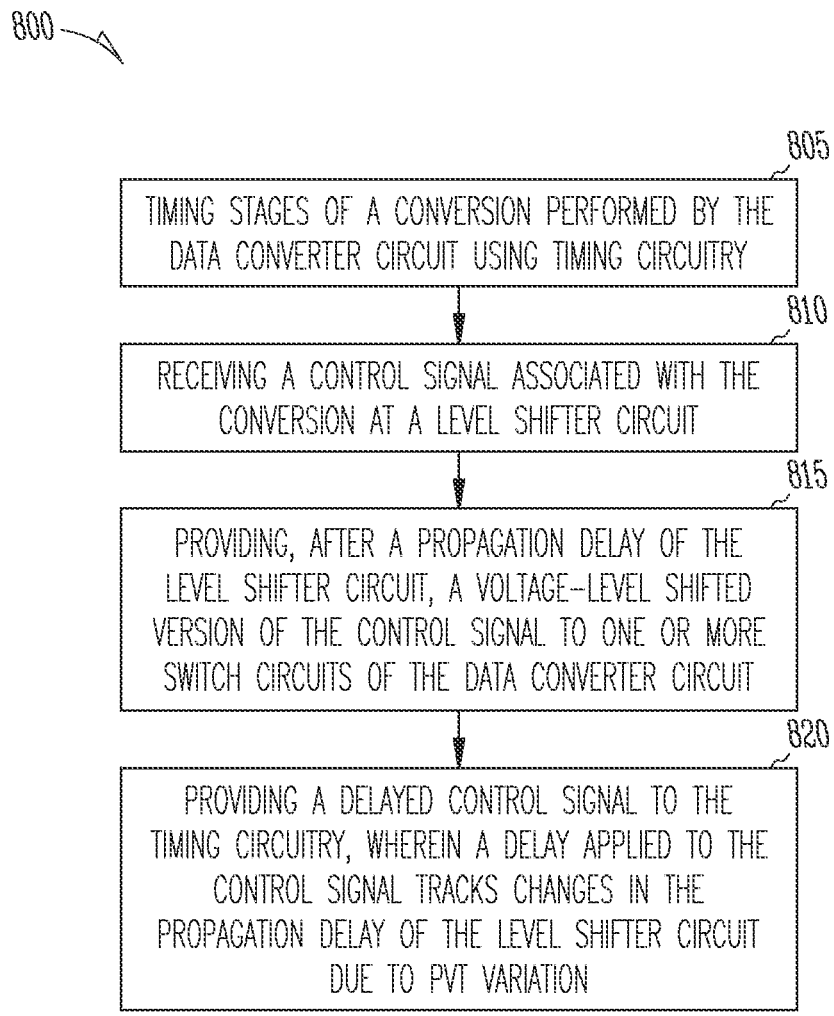
FIG. 8 is a flow diagram of an example of a method of operating a data converter circuit.

FIG. 8 is a flow diagram of an example of a method 800 of operating a data converter circuit. At 805, stages of a conversion performed by the data converter circuit are timed using timing circuitry. At 810, a control signal associated with the conversion is received at a level shifter circuit of the data converter circuit. At 815, after a propagation delay of the level shifter circuit, a voltage-level shifted version of the control signal is provided to one or more switch circuits of the data converter circuit. At 820, a delayed control signal is provided to the timing circuitry. The delay applied to the control signal changes with process voltage temperature (PVT) variation to track changes in the propagation delay of the level shifter circuit due to the PVT variation without the need for process characterization and trim.

The devices, systems and methods described herein avoid functional failures of ADCs while avoiding need for extensive process characterization across skew lots to determine trim-settings for the bottom plate level shifter delay $T_{BP,LVL}$. The generated $T_{BP,LVL}$ is just slightly greater than the required $T_{BP,LVL}$. Therefore, wastage of conversion time to accommodate possible process variation is minimized; resulting in speed improvement of overall converter. For a two-stage ADC, the top-plate sampling instances of the mini-ADC and the main ADC can be exactly aligned by using replica-paths that mimic delays of level-shifters that control mini-ADC sampling switches. This reduces circuit redundancy budget for the ADC.

Additional Description and Aspects

A first Aspect (Aspect 1) can include subject matter (such as a data converter circuit) comprising timing circuitry configured to time stages of a conversion performed by the data converter circuit; a level shifter circuit configured to receive a control signal associated with the conversion and provide a level shifted version of the control signal to one or more switch circuits of the data converter circuit; and a time delay circuit element including a replica circuit of the level shifter circuit that adds a circuit delay to a transition of the control signal at the timing circuitry.

In Aspect 2, the subject matter of Aspect 1 optionally includes multiple circuit devices having different device feature sizes including core domain devices and an input-output (I/O) domain devices; and wherein the time delay circuit element includes the replica circuit of the level shifter circuit and a buffer circuit including at least one core domain device and at least one I/O domain device.

In Aspect 3, the subject matter of one or both of Aspects 1 and 2 optionally include the data converter circuit being a digital-to-analog converter (DAC) circuit.

In Aspect 4, the subject matter of Aspect 3 optionally includes a comparator circuit including a latch circuit, and a DAC circuit including timing circuitry configured to time bit trials performed using the comparator circuit and the DAC circuit. The delay added by the time delay circuit element corresponds to a delay in a time duration from a bit trial result being available at an output of the latch circuit to a change in state of the bottom-plate switch circuits of the DAC circuit.

In Aspect 5, the subject matter of one or both of Aspects 3 and 4 optionally includes sampling switches operating in a core-supply domain and input-output (I/O) supply domain; multiple circuit devices having different device feature sizes including core domain devices and I/O domain devices; and a time delay circuit element including a replica circuit of the level shifter circuit and a buffer circuit operating in the core-supply domain and including at least one I/O domain device.

In Aspect 6, the subject matter of one or any combination of Aspects 3-5 optionally include a DAC circuit that is a capacitive DAC circuit and the level shifted control signal is provided to a switch circuit coupled to a bottom plate connection of a capacitor of the capacitive DAC circuit.

In Aspect 7, the subject matter of one or any combination of Aspects 1-6 optionally includes the data converter circuit being an analog-to-digital converter (ADC) circuit.

In Aspect 8, the subject matter of Aspect 7 optionally includes the data converter circuit being a successive approximation register analog-to-digital converter (SAR ADC) circuit.

In Aspect 9, the subject matter of one or both of Aspects 7 and 8 optionally include a first stage ADC circuit; wherein the one or more switch circuits receiving the level shifted control signal are included in the first stage ADC circuit and are input-output (I/O) domain devices; a main stage ADC circuit including one or more switch circuits that are core domain devices; and a time delay circuit element that adds delay to the control signal to align a transition of the control signal at a core domain switch circuit of the main stage ADC circuit with a transition of the level shifted control signal at an I/O domain switch circuit of the first stage ADC circuit.

In Aspect 10, the subject matter of Aspect 9 optionally includes a first stage ADC circuit including a first capacitive digital-to-analog converter (DAC) circuit and the main ADC circuit includes a second capacitive DAC circuit; and the control signal controls a core domain switch circuit coupled to a top plate connection of a capacitor of the second capacitive DAC circuit and the level shifted control signal controls an I/O domain switch circuit coupled to a top plate connection of a capacitor of the first capacitive DAC circuit.

Aspect 11 can include subject matter (such as a successive approximation register analog-to-digital converter (SAR ADC) circuit) or can optionally be combined with one or any combination of Aspects 1-10 to include such subject matter, comprising a first stage ADC circuit including input-output (I/O) domain devices configured to operate in an I/O supply domain; a main stage ADC circuit including core domain devices configured to operate in a core supply domain; timing circuitry configured to provide one or more control signals to the first stage ADC circuit and the main stage ADC circuit; a level shifter circuit configured to provide a level shifted version of a control signal of the one or more control signals to an I/O domain device of the first stage ADC circuit; and a time delay circuit element configured to delay the control signal of the one or more control signals to time align a transition of the control signal at a core domain device of the main ADC circuit with a transition of the level shifted control signal at the I/O domain device of the first ADC circuit.

In Aspect 12, the subject matter of Aspect 11 optionally includes a time delay circuit element including a replica circuit of the level shifter circuit and a buffer circuit operating in the core domain and including at least one I/O domain device.

In Aspect 13, the subject matter of one or both of Aspects 11 and 12 optionally includes a buffer circuit including a first inverter comprised of I/O domain devices that operate in a core supply domain, and a second inverter comprised of core domain devices that operate in the core supply domain.

In Aspect 14, the subject matter of one or any combination of Aspects 11-13 optionally includes a first stage ADC circuit including a first capacitive digital-to-analog (DAC) circuit; a main stage ADC circuit including a second capacitive DAC circuit; and the control signal controls a core domain switch circuit coupled to a top plate connection of a capacitor of the main stage ADC circuit and the level shifted control signal controls an I/O domain switch circuit coupled to a top plate connection of a capacitor of the first stage ADC circuit.

Aspect 15 can include subject matter (such as a method of operating a data converter circuit) or can optionally be combined with one or any combination of Aspects 1-14 to include such subject matter, comprising timing stages of a conversion performed by the data converter circuit using timing circuitry; receiving a control signal associated with the conversion at a level shifter circuit; providing, after a propagation delay of the level shifter circuit, a voltage-level shifted version of the control signal to one or more switch circuits of the data converter circuit; and providing a delayed control signal to the timing circuitry, wherein a circuit delay applied to the control signal varies with one or more of Fabrication Process, Supply Voltage, and Temperature (PVT) the same as the propagation delay of the level shifter varies with the one or more of Fabrication Process, Supply Voltage, and Temperature.

In Aspect 16, the subject matter of Aspect 15 optionally includes delaying the control signal using a replica circuit of the level shifter circuit and a buffer circuit, the buffer circuit including at least one I/O domain device having I/O domain feature size.

In Aspect 17, the subject matter of Aspect 16 optionally includes operating the replica circuit in an I/O supply domain and operating the buffer circuit in a core supply domain.

In Aspect 18, the subject matter of one or any combination of Aspects 15-17 optionally includes performing a bit trial of the conversion using a comparator circuit and a capacitive digital-to-analog converter (cap-DAC) circuit; and delaying the control signal to provide a delay to a time duration from a result of the bit trial being available at an output of the comparator circuit to a change in state of bottom-plate switch circuits of the cap-DAC circuit.

In Aspect 19, the subject matter of one or any combination of Aspects 15-18 optionally includes performing a bit trial of the conversion using a comparator circuit and a capacitive digital-to-analog converter (cap-DAC) circuit; and includes providing a level shifted activation signal to a switch circuit coupled to a bottom plate connection of a capacitor of the cap-DAC circuit.

In Aspect 20, the subject matter of one or any combination of Aspects 15-19 optionally includes timing stages of an analog-to-digital (A/D) conversion performed by the data converter circuit.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A data converter circuit comprising:
   timing circuitry configured to time stages of a conversion performed by the data converter circuit;
   a level shifter circuit configured to receive a control signal associated with the conversion and provide a level shifted version of the control signal to one or more switch circuits of the data converter circuit; and
   a time delay circuit element including a replica circuit of the level shifter circuit that adds a circuit delay to a transition of the control signal at the timing circuitry, and transitions the control signal from a core circuit supply voltage to an input-output (I/O) circuit supply voltage and back to the core circuit supply voltage, wherein the I/O circuit supply voltage is greater than the core circuit supply voltage.

2. The data converter circuit of claim 1, including:
   multiple circuit devices having different device feature sizes including core domain devices with a feature size to operate with the core circuit supply voltage and I/O domain devices with a feature size to operate with the I/O circuit supply voltage; and
   wherein the time delay circuit element includes the replica circuit of the level shifter circuit and a buffer circuit including at least one core domain device and at least one I/O domain device.

3. The data converter circuit of claim 1, wherein the data converter circuit includes a digital-to-analog converter (DAC) circuit.

4. The data converter circuit of claim 3, including:
   a comparator circuit including a latch circuit;
   wherein the DAC circuit includes multiple sampling switch circuits;
   wherein the timing circuitry is configured to time bit trials performed using the comparator circuit and the DAC circuit; and
   wherein the delay added by the time delay circuit element corresponds to a delay in a time duration from a bit trial result being available at an output of the latch circuit to a change in state of the bottom-plate switch circuits of the DAC circuit.

5. The data converter circuit of claim 4,
   wherein the sampling switch circuits of the DAC circuit include sampling switches configured to operate with the core circuit supply and the I/O circuit supply;
   multiple circuit devices having different device feature sizes including core domain devices with a feature size to operate with the core circuit supply voltage and I/O domain devices with a feature size to operate with the I/O circuit supply voltage; and
   wherein the time delay circuit element includes a replica circuit of the level shifter circuit and a buffer circuit operating with the core circuit supply voltage and including at least one device with a feature size to operate with the I/O circuit supply voltage.

6. The data converter circuit of claim 3, wherein the DAC circuit is a capacitive DAC circuit and the level shifted control signal is provided to a switch circuit coupled to a bottom plate connection of a capacitor of the capacitive DAC circuit.

7. The data converter circuit of claim 1, wherein the data converter circuit is an analog-to-digital converter (ADC) circuit.

8. The data converter circuit of claim 7, wherein the data converter circuit is a successive approximation register analog-to-digital converter (SAR ADC) circuit.

9. The data converter circuit of claim 7, including:
   a first stage ADC circuit; wherein the one or more switch circuits receiving the level shifted control signal are included in the first stage ADC circuit and are I/O domain devices having a feature size to operate with the I/O circuit supply voltage;
   a main stage ADC circuit including one or more switch circuits that are core domain devices having a feature size to operate with the core circuit supply voltage; and
   wherein the time delay circuit element adds delay to the control signal to align a transition of the control signal at a core domain switch circuit of the main stage ADC circuit with a transition of the level shifted control signal at an I/O domain switch circuit of the first stage ADC circuit.

10. The data converter circuit of claim 9,
    wherein the first stage ADC circuit includes a first capacitive digital-to-analog converter (DAC) circuit and the main ADC circuit includes a second capacitive DAC circuit; and
    wherein the control signal controls a switch circuit with a feature size to operate with the core circuit supply voltage coupled to a top plate connection of a capacitor of the second capacitive DAC circuit and the level shifted control signal controls a switch circuit with a feature size to operate with the I/O circuit supply voltage coupled to a top plate connection of a capacitor of the first capacitive DAC circuit.

11. A successive approximation register analog-to-digital converter (SAR ADC) circuit comprising:
- a first stage ADC circuit including input-output (I/O) domain devices configured to operate with an I/O circuit supply voltage;
- a main stage ADC circuit including core domain devices configured to operate with a core circuit supply voltage;
- timing circuitry configured to provide one or more control signals to the first stage ADC circuit and the main stage ADC circuit;
- a level shifter circuit configured to provide a level shifted version of a control signal of the one or more control signals to an I/O domain device of the first stage ADC circuit; and
- a time delay circuit element that includes a replica circuit of the level shifter circuit that level shifts a core circuit supply voltage version of the control signal from the core circuit supply voltage to the I/O circuit supply voltage and adds a circuit delay to the level shifted version of the control signal that level shifts the control signal back to the core circuit supply voltage to time align a transition of the control signal at a core circuit supply device of the main ADC circuit with a transition of the level shifted control signal at the I/O circuit supply device of the first ADC circuit, wherein the I/O circuit supply voltage is greater than the core circuit supply voltage.

12. The SAR ADC circuit of claim 11, wherein the time delay circuit element includes a buffer circuit operating with a core circuit supply voltage and including at least one I/O domain device with a feature size to operate with the I/O circuit supply voltage.

13. The SAR ADC circuit of claim 11, wherein the buffer circuit includes a first inverter comprised of I/O domain devices that operate with a core circuit supply voltage and are sized to operate with the I/O circuit supply voltage, and a second inverter comprised of core domain devices that operate in the core supply domain.

14. The SAR ADC circuit of claim 11,
- wherein the first stage ADC circuit includes a first capacitive digital-to-analog (DAC) circuit;
- wherein the main stage ADC circuit includes a second capacitive DAC circuit;
- wherein the control signal controls a switch circuit configured to operate with the core circuit supply voltage coupled to a top plate connection of a capacitor of the main stage ADC circuit and the level shifted control signal controls a switch circuit configured to operate with the I/O circuit supply voltage coupled to a top plate connection of a capacitor of the first stage ADC circuit.

15. A method of operating a data converter circuit, the method comprising:
- timing stages of a conversion performed by the data converter circuit using timing circuitry;
- receiving a control signal associated with the conversion at a level shifter circuit;
- providing, after a propagation delay of the level shifter circuit, a voltage-level shifted version of the control signal to one or more switch circuits of the data converter circuit; and
- providing a delayed control signal to the timing circuitry, wherein a circuit delay applied to the control signal includes the propagation delay of the level shifter circuit and transitions the control signal from a core circuit supply voltage to an input-output (I/O) circuit supply voltage and back to the core circuit supply voltage, wherein the I/O circuit supply voltage is greater than the core circuit supply voltage, and the circuit delay varies with one or more of Fabrication Process, Supply Voltage, and Temperature (PVT) the same as the propagation delay of the level shifter varies with the one or more of Fabrication Process, Supply Voltage, and Temperature.

16. The method of claim 15, wherein providing the delayed control signal to the timing circuitry includes delaying the control signal using a replica circuit of the level shifter circuit and a buffer circuit, the buffer circuit including at least one I/O domain device having I/O domain feature size.

17. The method of claim 16, including operating the replica circuit with the I/O circuit supply voltage and operating the buffer circuit with the core circuit supply voltage.

18. The method of claim 15, including:
- performing a bit trial of the conversion using a comparator circuit and a capacitive digital-to-analog converter (cap-DAC) circuit; and
- wherein delaying the control signal provides a delay to a time duration from a result of the bit trial being available at an output of the comparator circuit to a change in state of bottom-plate switch circuits of the cap-DAC circuit.

19. The method of claim 15, including:
- performing a bit trial of the conversion using a comparator circuit and a capacitive digital-to-analog converter (cap-DAC) circuit; and
- wherein providing the voltage-level shifted version of the control signal to one or more switch circuits includes providing a level shifted activation signal to a switch circuit coupled to a bottom plate connection of a capacitor of the cap-DAC circuit.

20. The method of claim 15, wherein the timing the stages of the conversion includes timing stages of an analog-to-digital (A/D) conversion performed by the data converter circuit.

* * * * *

UNITED STATES PATENT AND TRADEMARK OFFICE
CERTIFICATE OF CORRECTION

PATENT NO. : 11,438,005 B2  
APPLICATION NO. : 17/165428  
DATED : September 6, 2022  
INVENTOR(S) : Kamble et al.

Page 1 of 1

It is certified that error appears in the above-identified patent and that said Letters Patent is hereby corrected as shown below:

In the Claims

In Column 11, Lines 33-34, in Claim 12, after "one", delete "I/O domain"

Signed and Sealed this
Twenty-seventh Day of June, 2023

Katherine Kelly Vidal
*Director of the United States Patent and Trademark Office*